(12) United States Patent
Whigham et al.

(10) Patent No.: US 6,263,590 B1
(45) Date of Patent: Jul. 24, 2001

(54) METHOD AND APPARATUS FOR CONTROLLING BYPRODUCT INDUCED DEFECT DENSITY

(75) Inventors: William A. Whigham; Mark E. Culp, both of Austin; Allan T. Nelson, Bastrop, all of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/351,982

(22) Filed: Jul. 12, 1999

(51) Int. Cl.[7] ........................................................ F26B 7/00
(52) U.S. Cl. ............................................................. 34/426
(58) Field of Search ................................ 34/380, 418, 426, 34/210, 215, 217, 218, 68; 134/1.1, 22.1, 902; 118/715

(56) References Cited

U.S. PATENT DOCUMENTS

| | | | |
|---|---|---|---|
| 5,621,982 | * | 4/1997 | Yamashita et al. ............... 34/203 |
| 6,107,198 | * | 8/2000 | Lin et al. ........................ 438/680 |
| 6,139,642 | * | 10/2000 | Shimahara et al. ............. 118/724 |
| 6,165,272 | * | 12/2000 | Liu .................................. 118/715 |

* cited by examiner

Primary Examiner—Pamela Wilson
(74) Attorney, Agent, or Firm—Williams, Morgan, & Amerson, P.C.

(57) ABSTRACT

A method and apparatus for reducing byproduct induced defects in a processing tool is provided. A purge gas is introduced into a vessel of the processing tool. The vessel is heated to a temperature above a vaporization temperature of the byproduct. The temperature is maintained for a predetermined period of time. The vessel is purged to remove at least a portion of the byproduct.

19 Claims, 2 Drawing Sheets

METHOD AND APPARATUS FOR CONTROLLING BYPRODUCT INDUCED DEFECT DENSITY

BACKGROUND OF THE INVENTION

1. FIELD OF THE INVENTION

This invention relates generally to the field of semiconductor manufacturing, and, more particularly, to a method and apparatus for controlling byproduct induced defect density in semiconductor wafers.

2. DESCRIPTION OF THE RELATED ART

In the manufacture of semiconductor devices, wafers, such as silicon wafers, are subjected to a number of processing steps. The processing steps include depositing or forming layers, patterning the layers, and removing portions of the layers to define features on the wafer. One such process step is the formation of a layer by chemical vapor deposition, where reactive gases are introduced into a vessel containing the semiconductor wafers. The reactive gases facilitate a chemical reaction that causes a layer to form on the wafers.

Certain chemical reactions produce byproducts in addition to the desired material forming the layer. Some of these byproducts vaporize at the elevated processing temperatures at which the deposition process operates, and absorb into the forming layer, causing small particle defects in the film. As subsequent lots of wafers are processed, the concentration of the byproducts increases, causing a corresponding upward trend in the defect level on the wafers.

This increasing defect level may be monitored by known statistical process control techniques. When the defect level reaches a certain level, the processing tool is disassembled and cleaned to remove the byproduct materials, thus maintaining the defect density at acceptable levels.

An exemplary processing tool susceptible to byproduct production is a low pressure chemical vapor deposition (LPCVD) system used to deposit a silicon nitride $Si_3N_4$ layer. Silicon nitride layers are commonly used as passivation, masking, or insulating layers. In the LPCVD system, dichlorosilane ($SiH_2Cl_2$) is combined with ammonia ($NH_4$) to facilitate the chemical reaction that results in the deposition of the silicon nitride layer. An ammonium chloride ($NH_4Cl$) byproduct forms and builds up on the internal surfaces of the processing chamber. As nitride layers are formed on subsequent lots of wafers, the ammonium chloride deposits as particle defects within the silicon nitride layers. When the defect count reaches a predetermined level, the LPCVD tool is disassembled and cleaned.

Typically, the disassembly, cleaning, and re-assembly process takes at least 24 hours. The maintenance procedure is generally conducted after between 20 and 30 processing runs. The significant down time required to complete the cleaning procedure affects the production efficiency of the tool and the overall facility.

The present invention is directed to overcoming, or at least reducing the effects of, one or more of the problems set forth above.

SUMMARY OF THE INVENTION

One aspect of the present invention is seen in a method for reducing byproduct induced defects in a processing tool. A purge gas is introduced into a vessel of the processing tool. The vessel is heated to a temperature above a vaporization temperature of the byproduct. The temperature is maintained for a predetermined period of time. The vessel is purged to remove at least a portion of the byproduct.

BRIEF DESCRIPTION OF THE DRAWINGS

The invention may be understood by reference to the following description taken in conjunction with the accompanying drawings, in which like reference numerals identify like elements, and in which.

Figure 1:
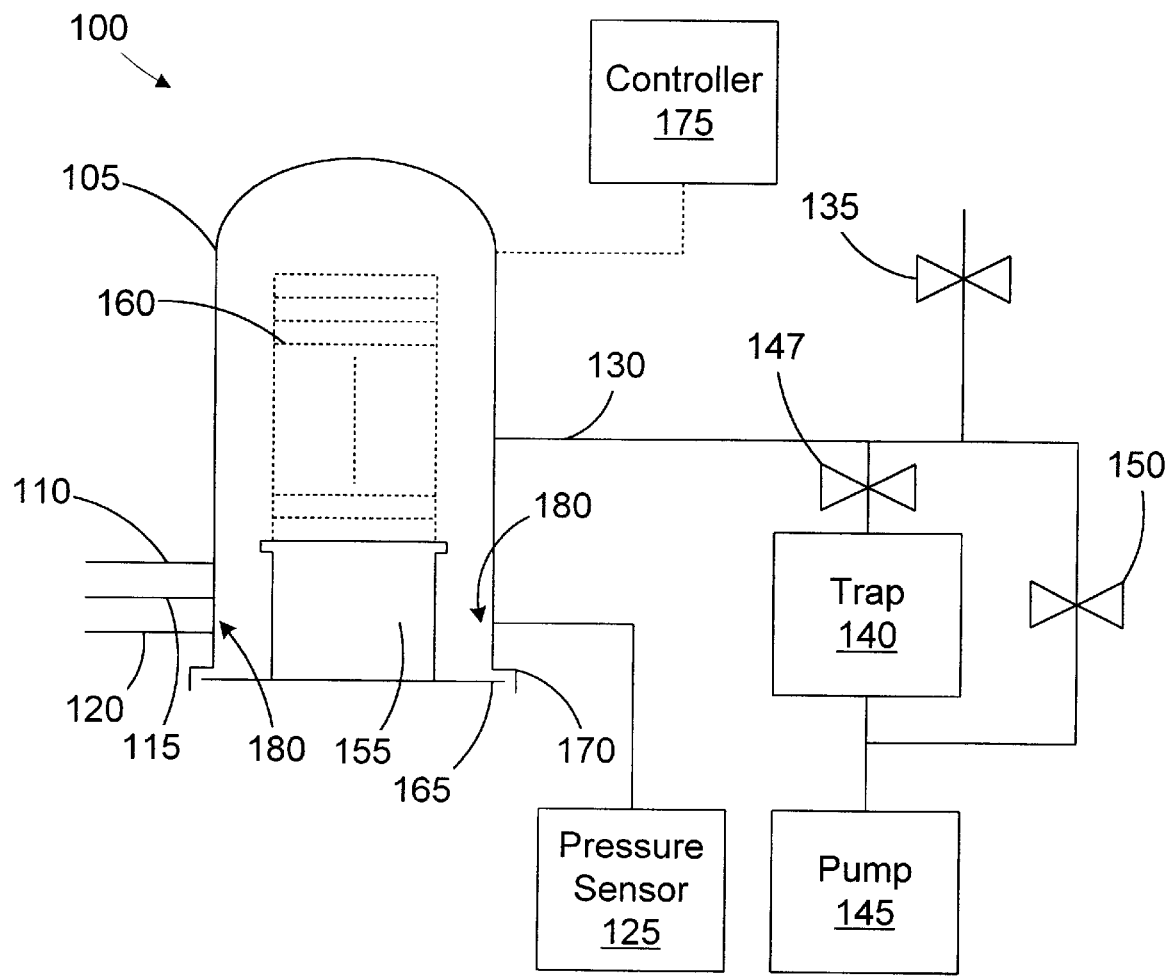
FIG. 1 is a simplified diagram of a processing tool in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to the figures, and in particular, to FIG. 1, a simplified diagram of a processing tool 100 is provided. In the illustrated embodiment, the processing tool 100 is a low pressure chemical vapor deposition (LPCVD) tool useful for depositing a silicon nitride layer ($Si_3N_4$) on a semiconductor wafer. Although the invention is described as it may be implemented in a LPCVD tool, it is contemplated that the concepts described herein may be applied to various other processing tools, related or not related to semiconductor fabrication, wherein the processing of a given article results in the formation of a byproduct. The drawing of the processing tool 100 in FIG. 1 is provided for illustrative purposes, and is not intended to represent a physical drawing of an actual processing tool.

The processing tool 100 includes a vessel 105. Process gas lines 110, 115 are coupled to the vessel 105 to allow introduction of process gases. A purge line 120 is coupled to the vessel 105 to allow introduction of a purge gas for removing remaining process gases after a production run has been completed. In the illustrated embodiment, the process gases supplied through the process gas lines 110, 115 are dichlorosilane ($SiH_2Cl_2$) and ammonia ($NH_4$), which are commonly used to deposit silicon nitride layers.

A pressure sensor 125, such as a Baratron® capacitance manometer, sold by MKS Instruments, Inc., is coupled to the vessel 105 for monitoring the pressure within the vessel 105. An exhaust line 130 is coupled to the vessel 105 to receive exiting process or purge gases. A relief valve 135 is coupled to the exhaust line 130 to provide overpressure protection. The exhaust gases pass through a trap 140 where the process gases are removed by condensation to prevent them from entering the pump 145. Flow through the trap is governed by a valve 147. A bypass valve 150 is provided to allow slow, non-turbulent flow during initial pump down of the vessel 105. A boat 155 housing wafers 160 is inserted into the vessel 105 for processing. A bottom plate 165 on the boat 155 interfaces with a flange 170 on the vessel 105 to provide a sealing surface. A controller 175 is provided to control the process parameters of the processing tool 100 in accordance with a predetermined recipe.

During the formation of a silicon nitride layer on the wafers 160, ammonia and dichlorosilane are introduced into the vessel 105. The normal operating temperatures maintained during the deposition process are between about 700° C. and 800° C. An ammonium chloride byproduct forms during the reaction of the ammonia with the dichlorosilane. The byproduct builds up on the internal surfaces of the vessel 105, particularly, near gas manifold connections 180. As nitride layers are formed on subsequent lots of wafers 160, the byproduct deposits as particle defects within the silicon nitride layers.

Figure 2:
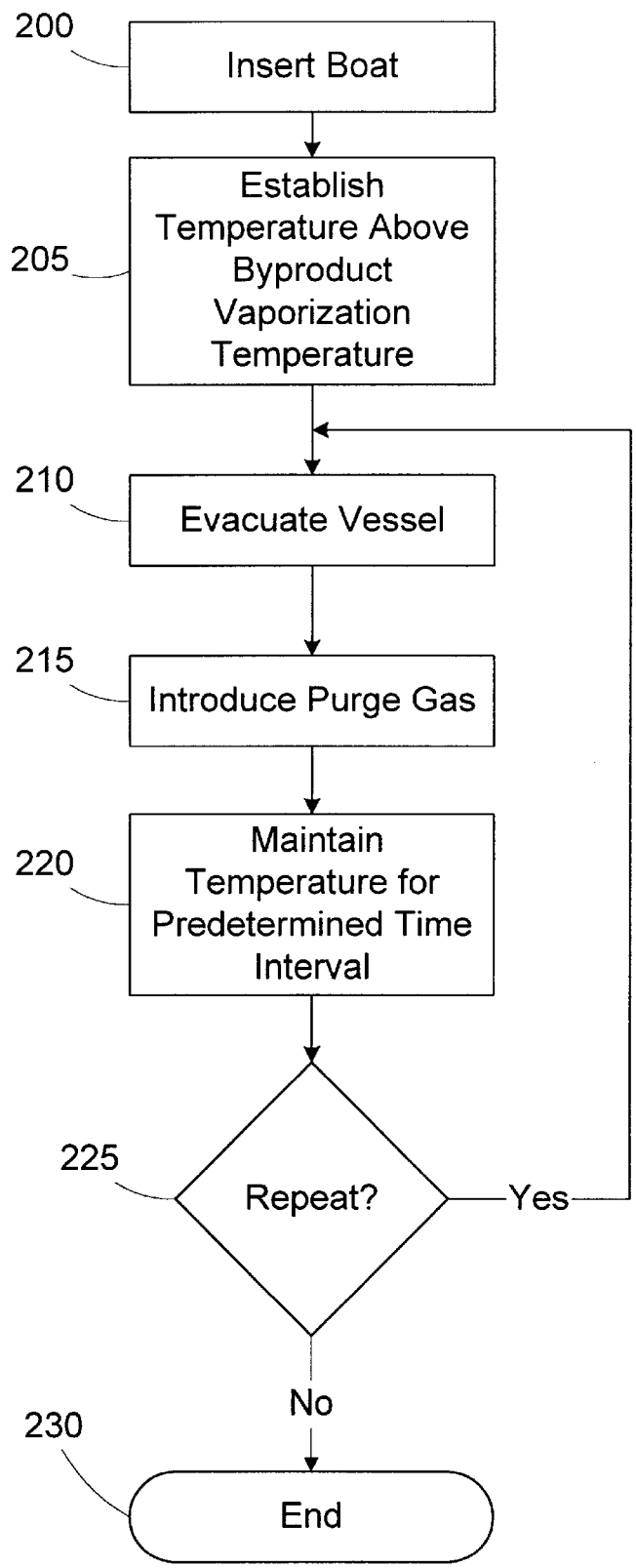
FIG. 2 is a flow diagram of a method for controlling byproduct induced defect density in the processing tool of FIG. 1.

Turning now to FIG. 2, a flow diagram of a method for controlling byproduct induced defect density in the processing tool 100 is provided. To accomplish the method, the controller 175 is programmed with a byproduct reduction recipe. In general, the byproduct concentrations are lowered by heating the vessel to a temperature above the vaporization temperature of the byproduct and purging the vessel 105 to remove the vaporized byproduct. This reduces the amount of byproduct in the vessel 105, thus lowering the byproduct induced defects in subsequent processing runs. By reducing the byproduct concentrations, the processing tool 100 may be operated for increased numbers of runs between tool tear-down and cleaning. The method is described in greater detail with reference to FIG. 2.

A boat 155, either empty or containing dummy wafers (not shown) is inserted into the vessel 105 in block 200. In the illustrated embodiment, the boat 155 is provided to seal the vessel 105. In other embodiments, where the vessel 105 is sealed in another manner, the boat 155 (i.e., or other article carrier) may not be required. The temperature of the vessel 105 is maintained at a temperature that exceeds the byproduct vaporization temperature in block 205. In the illustrated embodiment, the vessel 105 is maintained at a temperature in the range of about 800° C. to 900° C.

In block 210, the vessel 105 is pumped down to establish an initial vacuum condition. In the illustrated embodiment, the vessel 105 is pumped down to a pressure of about between 2 and 6 mtorr (i.e., minimum pressure achievable by the pump 145) using a purge gas of nitrogen supplied through the purge line 120. It is assumed that all process gases had been previously purged at the end of the most recent processing run. In the illustrated embodiment, about four liters of purge gas is introduced in block 215 to raise the pressure in the vessel 105 (e.g., to about 700 to 800 mtorr). In block 220, the temperature is maintained in the vessel 105 for a predetermined time interval (e.g., 15 minutes) to vaporize the byproduct material.

The evacuate, purge, and maintain cycles of blocks 210, 215, and 220 are repeated as necessary in block 225 to increase the amount of byproduct removed. In the illustrated embodiment, the process is repeated three times, and is terminated in block 230. The processing tool is then ready for subsequent production runs.

The byproduct reduction described in reference to FIG. 2 is conducted after about every five processing runs. Using the byproduct reduction technique increases the number of runs achievable between tear-downs of the processing tool 100. In one example, the processing tool 100 may be operated for between about 40 and 60 processing runs between tear-downs. The byproduct reduction process may be repeated at any desired interval to further increase the number of achievable processing runs. The resulting increase in processing runs increases the availability of the processing tool 100, and in cases where the processing tool 100 is a limiting component in the production line, the increased operating time may also increase the production efficiency of the fabrication facility.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for reducing byproduct induced defects in a processing tool, comprising:
   sealing a vessel of the processing tool between processing runs of the processing tool;
   intruducing a purge gas into the vessel;
   heating the vessel to a temperature above a vaporization temperature of the byproduct;
   maintaining the temperature for a predetermined period of time; and
   purging the vessel to remove at least a portion of the byproduct.

2. The method of claim 1, further comprising evacuating the vessel.

3. The method of claim 1, further comprising repeating the maintaining and the purging a predetermined number of times.

4. The method of claim 1, wherein maintaining the temperature includes maintaining the temperature at a temperature of between about 800° C. and 900° C.

5. The method of claim 1, wherein maintaining the temperature includes maintaining the temperature for about 15 minutes.

6. The method of claim 1, wherein providing the purge gas includes providing nitrogen.

7. The method of claim 1, wherein the byproduct comprises ammonium chloride, and maintaining the temperature includes maintaining the temperature above the vaporization temperature of the ammonium chloride.

8. The method of claim 1, wherein sealing the vessel includes sealing the vessel with an article carrier.

9. The method of claim 1, wherein sealing the vessel includes sealing the vessel with a semiconductor wafer boat.

10. A processing tool, comprising:
    a vessel having a byproduct deposited thereon;
    a purge line coupled to said vessel; and
    a controller programmed with a recipe, that when executed:
    seal the vessel between processing runs;
    provides a purge gas through the purge line;
    maintains the temperature of the vessel tool above a vaporization temperature of the byproduct;
    maintains the temperature for a predetermined period of time; and purges the vessel to remove at least a portion of the byproduct.

11. The processing tool of claim 10, wherein the recipe, when executed, evacuates the vessel.

12. The processing tool of claim 10, wherein the recipe, when executed, repeats the maintaining and the purging a predetermined number of times.

13. The processing tool of claim 10, wherein the temperature of the vessel is maintained at a temperature of between about 800° C. and 900° C.

14. The processing tool of claim 10, wherein the temperature is maintained for about 15 minutes.

15. The processing tool of claim 10, wherein the purge gas comprises nitrogen.

16. The processing tool of claim 10, wherein the byproduct comprises ammonium chloride.

17. The processing tool of claim 10, further comprising an article carrier adapted to seal the vessel.

18. The processing tool of claim 17, wherein the article carrier comprises a semiconductor wafer boat.

19. An apparatus for reducing byproduct induced defects in a processing tool, comprising:

means for sealing a vessel of the processing runs of the processing tool;

means for introducing a purge gas into the vessel;

means for heating the vessel to a temperature above a vaporization temperature of the byproduct;

means for maintaining the temperature for a predetermined period of time; and means for purging the vessel to remove at least a portion of the byproduct.

* * * * *